United States Patent
Chang

(10) Patent No.: US 7,841,536 B2
(45) Date of Patent: Nov. 30, 2010

(54) PORTABLE ELECTRONIC DEVICE WITH ORIENTATION SENSOR

(75) Inventor: Jen-Tsorng Chang, Taipei Hsien (TW)

(73) Assignee: Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 1 day.

(21) Appl. No.: 12/166,722

(22) Filed: Jul. 2, 2008

(65) Prior Publication Data

US 2009/0031570 A1 Feb. 5, 2009

(30) Foreign Application Priority Data

Jul. 31, 2007 (CN) .......................... 2007 1 0201225

(51) Int. Cl.
*G06K 7/00* (2006.01)
(52) U.S. Cl. ..................................................... 235/486
(58) Field of Classification Search ................. 235/472, 235/472.01, 477, 485, 486; 33/305, 366.12, 33/366.18, 367, 379, 384, 389; 73/1.06, 73/1.31, 1.45, 1.77, 1.83
See application file for complete search history.

(56) References Cited

U.S. PATENT DOCUMENTS

| | | | | |
|---|---|---|---|---|
| 3,822,944 A | * | 7/1974 | Hopkins et al. | 356/139.06 |
| 4,447,735 A | * | 5/1984 | Horii | 348/319 |
| 5,536,930 A | * | 7/1996 | Barkan et al. | 235/472.01 |
| 5,704,130 A | * | 1/1998 | Augustin et al. | 33/366.12 |
| 5,910,882 A | * | 6/1999 | Burrell | 361/679.56 |
| 6,441,828 B1 | * | 8/2002 | Oba et al. | 345/659 |
| 7,526,870 B2 | * | 5/2009 | Klapper et al. | 33/366.23 |

FOREIGN PATENT DOCUMENTS

WO  WO2007059736  * 5/2007

* cited by examiner

*Primary Examiner*—Seung H Lee
(74) *Attorney, Agent, or Firm*—Zhigang Ma

(57) ABSTRACT

A portable electronic device includes a main body, a display screen formed on the main body, and an orientation sensor mounted on the main body. The orientation sensor includes a ring-shaped container having an opaque liquid and a gas bubble sealed therein, and a detection assembly. The detection assembly includes a light source, many spaced light detection elements, and a display controlling module. The gas bubble is movable in the container for allowing transmission of light from the at least one light source therethrough. Each of the light detection elements is configured for sensing the light transmitted through the gas bubble and outputting a sensing signal. The display controlling module is configured for deviating the displayed image at a given angle clockwise or counterclockwise from the original orientation of the image based on the sensing signals.

18 Claims, 3 Drawing Sheets

PORTABLE ELECTRONIC DEVICE WITH ORIENTATION SENSOR

BACKGROUND

1. Technical Field

The invention relates generally to portable electronic device and, particularly, to a portable electronic device with changeable orientation of image display.

2. Description of Related Art

Currently, portable electronic devices, such as portable computers, personal digital assistants (PDAs), cellular telephones, etc., are becoming indispensable products for people in modern life. The user can use different input modes to input different functions of the portable electronic device, such as communication, playing games etc. A portable electronic device has been described in detail in a paper published by Stephan Hartwig et al. on IEEE Transactions on Consumer Electronics, Vol. 46, No. 4 (November, 2000), entitled "MOBILE MULTIMEDIA-CHALLENGES AND OPPORTUNITIES INVITED PAPER", the disclosure of which is fully incorporated herein by reference.

For certain modes and applications of the portable electronic device, a change of the displaying orientation of the information (e.g., image or text) is often required. However, the displaying orientation for the conventional portable electronic device cannot be changed according to a variation of posture of the conventional portable electronic device itself, which renders the portable electronic device inconvenient for the user to use.

What is needed, therefore, is a portable electronic device having a changeable orientation of the image display according to a variation of posture.

SUMMARY

A portable electronic device in accordance with an exemplary embodiment is provided. The portable electronic device includes a main body, a display screen formed on the main body for displaying image in an original orientation, and an orientation sensor mounted on the main body. The orientation sensor includes a ring-shaped container having an opaque liquid and a gas bubble sealed therein, and a detection assembly. The detection assembly includes at least one light source arranged at one side of the ring-shaped container, a plurality of spaced light detection elements arranged at another opposite side of the ring-shaped container, and a display controlling module. The gas bubble is movable in the ring-shaped container and configured for allowing transmission of light from the at least one light source therethrough. Each of the light detection elements is configured for sensing the light transmitted through the gas bubble and outputting a sensing signal. The display controlling module is configured for deviating the displayed image at a given angle clockwise or counterclockwise from the original orientation of the image based on the sensing signals.

Other novel features and advantages will become more apparent from the following detailed description when taken in conjunction with the accompanying drawings.

BRIEF DESCRIPTION OF THE DRAWINGS

Many aspects of the present portable electronic device with an orientation sensor can be better understood with reference to the following drawings. The components in the drawings are not necessarily drawn to scale, the emphasis instead being placed upon clearly illustrating the principles of the present invention.

Corresponding reference characters indicate corresponding parts. The exemplifications set out herein illustrate at least one preferred embodiment of the present invention, in one form, and such exemplifications are not to be construed as limiting the scope of the invention in any manner.

DETAILED DESCRIPTION OF THE INVENTION

Reference will now be made to the drawings to describe embodiments of the portable electronic device with an orientation sensor in detail.

Figure 1:
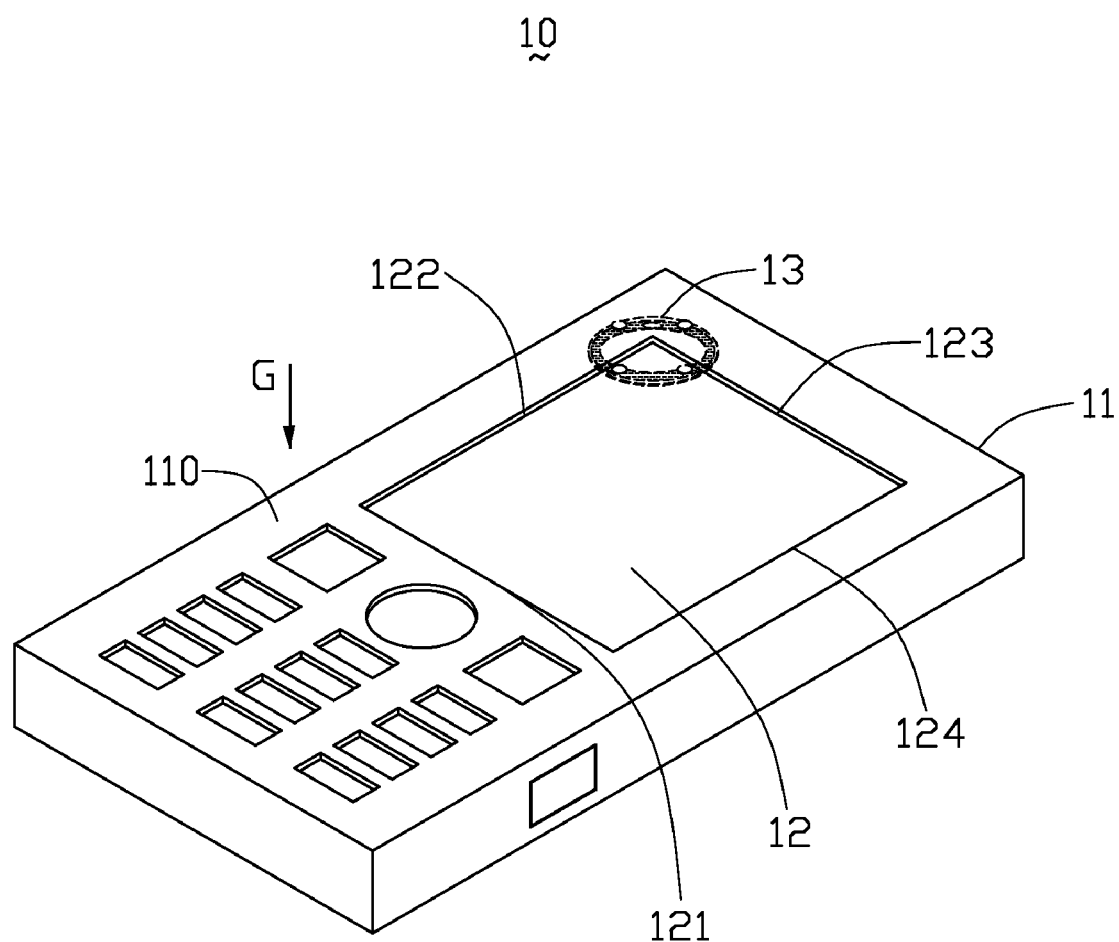
FIG. 1 is a schematic view of a portable electronic device with an orientation sensor in accordance with a preferred embodiment of the present invention.

Referring to FIG. 1, a portable electronic device 10 in accordance with a first exemplary embodiment, is shown. The portable electronic device 10 includes a main body 11, a display screen 12, and an orientation sensor 13. The main body 11 has a surface 110. The display screen 12 is formed on the surface 110 of the main body 11 and configured for displaying image in an original orientation thereon. The display screen 12 has four edges 121, 122, 123 and 124. The orientation sensor 13 is mounted on the main body 11, and arranged in parallel with the display screen 12.

Figure 2:
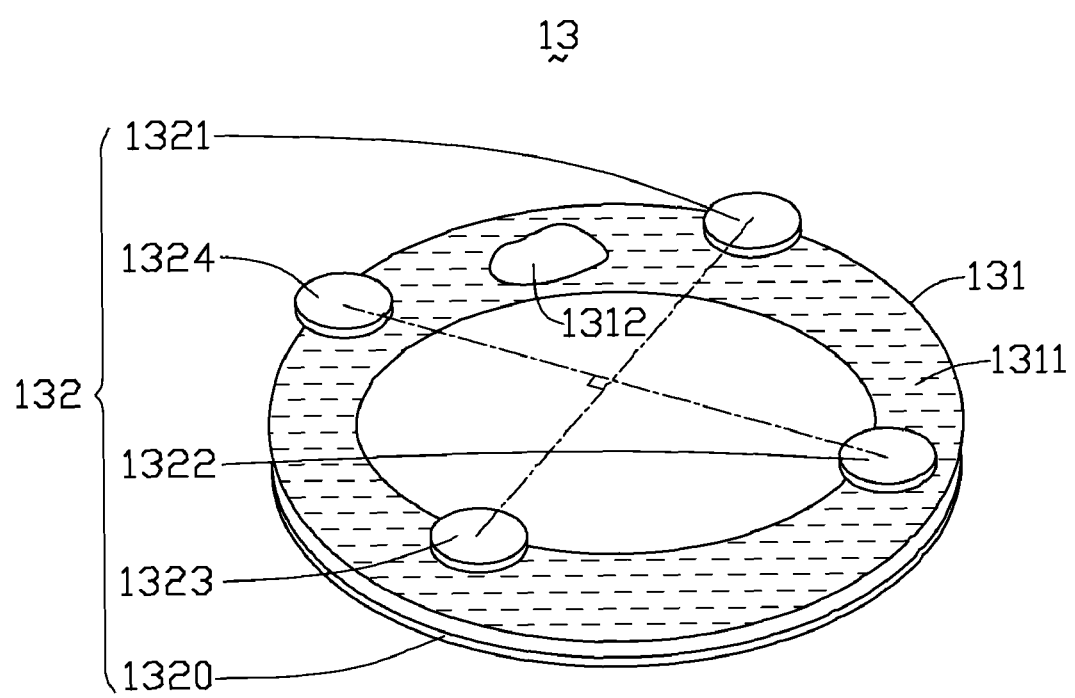
FIG. 2 is a schematic amplificatory view of the orientation sensor of FIG. 1.

Referring to FIG. 2, the amplificatory view of the orientation sensor 13 is shown. The orientation sensor 13 includes a ring-shaped container 131 and a detection assembly 132. A sectional shape of the ring-shaped container 131 is circular. The ring-shaped container 131 is arranged in parallel with the display screen 12. The ring-shaped container 131 has an opaque liquid 1311 and a gas bubble 1312 sealed therein. The opaque liquid 1311 can be organic solvent, dyes doped water, or other high fluidity liquid. The gas bubble 1312 can be air, nitrogen, or other gases that is not being dissolved in the opaque liquid 1311. The gas bubble 1312 is movable in the ring-shaped container 131 long a gravity reversal direction to the highest position of the ring-shaped container 131 under the action of gravity.

The detection assembly 132 includes a light source 1320, a first light detection element 1321, a second light detection element 1322, a third light detection element 1323, and a fourth light detection element 1324. The light source 1320 can be a surface light source, such as a light guide plate with at least one LED therein. The first light detection element 1321, the second light detection element 1322, the third light detection element 1323, and the fourth light detection element 1324 can be a charge coupled device (CCD).

The light source 1320 is placed on one side of the ring-shaped container 131, which opposite to the whole body of the ring-shaped container 131. All of the spaced light detection elements 1321, 1322, 1323, 1324 are arranged at another side of the ring-shaped container 131 and opposite to the light source 1320. The light detection elements 1321, 1322, 1323, 1324 are evenly distributed along a circumferential direction of the ring-shaped container 131, that is to say, an imaginary line connecting the first light detection element 1321 and the third light detection element 1323 is substantially perpendicular to an imaginary line connecting the second light detection element 1322 and the fourth light detection element 1324.

The portable electronic device 10 may have various posture, the following will take four vertical posture of the portable electronic device 10 as examples. The four vertical posture of the portable electronic device 10 are respectively represented by four edges 121, 122, 123, 124 of the display screen 12 respectively as the bottom edge of the display screen 12 in gravity direction (see the direction G of FIG. 1). When the portable electronic device 10 is at a first posture such that the edge 121 of the display screen 12 being the bottom edge of the display screen 12 in gravity direction, the gas bubble 1312 moves to the position opposite to the first light detection element 1321. It can be understood that, when the edges 122, 123, 124 of the display screen 12 respectively being the bottom edge of the display screen 12 in gravity direction, the gas bubbles 1312 can move to respective positions opposite to the second light detection element 1322, the third light detection element 1323 and the fourth light detection element 1324.

When the edge 121 of the display screen 12 being the bottom edge of the display screen 12 in gravity direction, the gas bubble 1312 is positioned between the first light detection element 1321 and the light source 1320 where defined as a first detection position, a light beam emitted from the light source 1320 can traverse the gas bubble 1312 and be detected by the first light detection element 1321. The first light detection element 1321 then transforms the light beam into a control signal. The control signal is transmitted to a display controlling module (not shown) on the main body 11. The image displayed in the display screen 12 can be deviated at a given angle clockwise or counterclockwise from the original orientation of the image to a first orientation (the gravity direction) based on the sensing signal.

When the edge 122 of the display screen 12 being the bottom edge of the display screen 12 in gravity direction, the gas bubble 1312 is located between the second light detection element 1322 and the light source 1320. That is to say, the gas bubble 1312 moves to a second detection position such that light emitted from the light source 1320 traverse the gas bubble 1312 and be detected by the second light detection element 1322, the image displayed in the display screen 12 is changed to a second orientation.

When the edge 123 of the display screen 12 being the bottom edge of the display screen 12 in gravity direction, the gas bubble 1312 is located between the third light detection element 1323 and the light source 1320. That is, the gas bubble 1312 moves to a third detection position such that light emitted from the light source 1320 can traverse the gas bubble 1312 and be detected by the third light detection element 1323, the image displayed in the display screen 12 is changed to a third orientation.

When the edge 124 of the display screen 12 being the lower edge of the display screen 12 in gravity direction, the gas bubble 1312 is located between the fourth light detection element 1324 and the light source 1320. That is, the gas bubble 1312 moves to a fourth detection position such that light emitted from the light source 1320 can traverse the gas bubble 1312 and be detected by the fourth light detection element 1324, the image displayed in the display screen 12 is changed to a fourth orientation.

Accordingly, the gas bubble 1312 can move to one detection position which the gas bubble 1312 allows transmission of light from the light source 1320 therethrough. The first light detection element 1321, the second light detection element 1322, the third light detection element 1323, or the fourth light detection element 1324 could sense the light transmitted through the gas bubble 1312 and output a sensing signal. The display controlling module deviates the image displayed in the display screen 12 at a given angle clockwise or counterclockwise from the original orientation of the image to different orientations corresponding to the detection positions. Therefore, when the portable electronic device 10 has different postures, the image displaying orientations can be changed to improve the practicability of the portable electronic device 10. In addition, cost of manufacturing the orientation sensor 13 is low.

Figure 3:
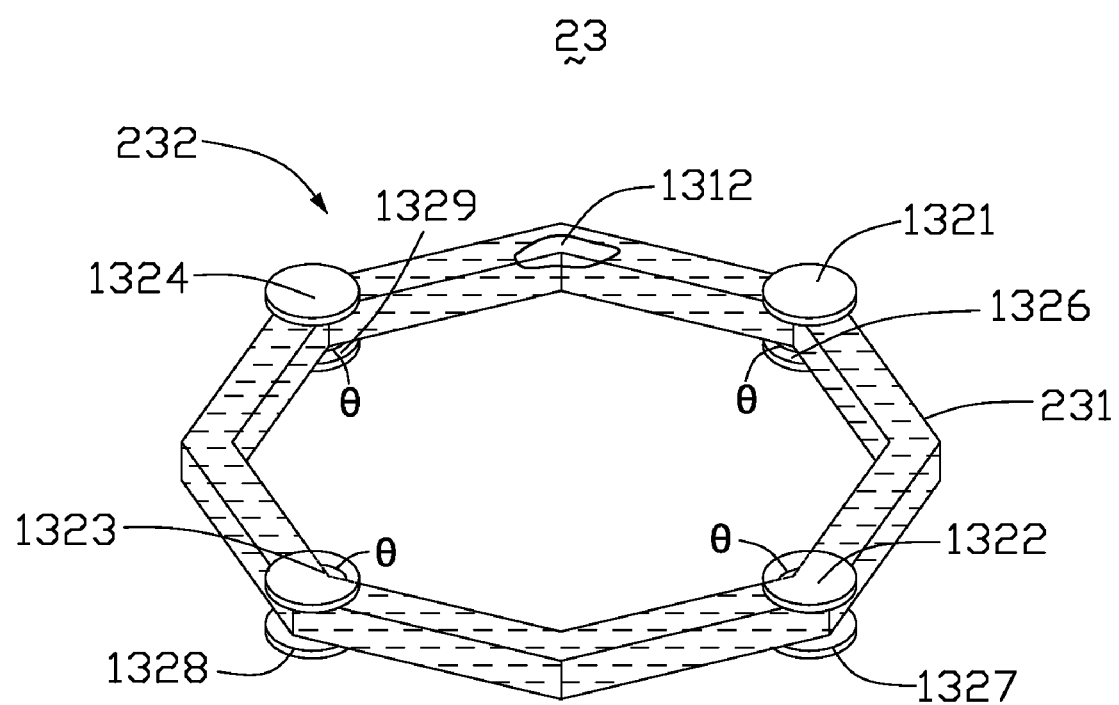
FIG. 3 is a schematic amplificatory view of an orientation sensor of a portable electronic device in another embodiment of the present invention.

Referring to FIG. 3, a portable electronic device in accordance with a second exemplary embodiment is similar to that of the first embodiment, except the orientation sensor. The portable electronic device in accordance with the second embodiment includes an orientation sensor 23. The orientation sensor 23 includes a ring-shaped container 231 and a detection assembly 232. Sectional shape of the ring-shaped container 231 is a quadrate. The ring-shaped container 231 has a polygonal configuration. In the present embodiment, the ring-shaped container 231 has an octagonal configuration. The detection assembly 232 includes a first light source 1326, a second light source 1327, a third light source 1328, and a fourth light source 1329, beside the light detection elements 1321, 1322, 1323, 1324. The light detection elements 1321, 1322, 1323, 1324 evenly spaced from each other. In the present embodiment, the light detection elements 1321, 1322, 1323, 1324 are respectively disposed at four corners of the octagonal ring-shaped container 231, and each two neighboring corners of the four corners have one of the spare four corners of the ring-shaped container therebetween. The light sources 1326, 1327, 1328, 1329 are aligned with the respectively light detection elements 1321, 1322, 1323, 1324. All the light sources 1326, 1327, 1328, 1329 may be light emitting diode. In the exemplary embodiment, each of the four corners which the light sources 1326, 1327, 1328, 1329 placed on has an internal angle θ ranged from 170 to 180 degrees, so the gas bubble 1312 being fastened by one corner of the ring-shaped container 231 can be avoided. It can be understood that, the ring-shaped container 231 may have regular octagonal structure, the portable electronic device may include two, three or other number light sources and light detection elements respectively opposite to these.

When the portable electronic device in accordance with the second embodiment has the different poses, and the gas bubble 1312 may move to one of the four corners that the light sources 1326, 1327, 1328, 1329 stayed, light beam emitted from the first light source 1326, the second light source 1327, the third light source 1328 or the fourth light source 1329 can traverse the gas bubble 1312 and be detected by the corresponding light detection element. The corresponding light detection element then transforms the light beam into a control signal. The control signal is transmitted to the display controlling module (not shown), so as to switch the image displayed in the display to different orientation by the display controlling module.

A method for switching the image displaying orientation of the portable electronic device 10 in accordance with a third embodiment, includes:

Adjusting the posture of the portable electronic device 10, to move the gas bubble 1312 to detection positions of the gas bubble 1312 respectively opposite to the light detection elements 1321, 1322, 1323 and 1324, and a light beam emitted from the light source 1320 can traverse the gas bubble 1312 and be detected by the light detection element which the gas bubble 1312 opposite to.

The light beam is transformed into a control signal by the light detection element which the gas bubble 1312 opposite to. The control signal is transmitted to a display controlling module (not shown) on main body 11 of the portable electronic device 10, then the orientation of the image displayed in the display screen 12 is changed by the display controlling module based on the control signal, so the image orientation of the portable electronic device are in conjunction with the respective detection positions of the gas bubble 1312 stayed.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A portable electronic device, comprising:
   a main body;
   a display screen formed on the main body for displaying an image in an original orientation; and
   an orientation sensor mounted on the main body, the orientation sensor comprising:
   a ring-shaped container comprising a first surface and a second surface at opposite sides thereof, the first and second surfaces both parallel with the display screen, the first surface facing the display screen, the ring-shaped container having an opaque liquid and a gas bubble sealed therein;
   a detection assembly including at least one light source arranged on the first surface of the ring-shaped container and a plurality of spaced light detection elements arranged on the second surface of the ring-shaped container, the at least one light source comprising a plurality of light sources aligned with the respective light detection elements, the gas bubble being movable in the ring-shaped container and configured for allowing transmission of light from one of the light sources therethrough, each of the light detection elements being configured for sensing the light transmitted through the gas bubble and outputting a sensing signal; and
   a display controlling module for deviating the displayed image at a given angle clockwise or counterclockwise from the original orientation of the image based on the sensing signals.

2. The portable electronic device of claim 1, wherein a sectional shape of the ring-shaped container is circular or quadrate.

3. The portable electronic device of claim 1, wherein the ring-shaped container has a polygonal configuration.

4. The portable electronic device of claim 1, wherein the plurality of light detection elements comprises a first light detection element, a second light detection element, a third light detection element, and a fourth light detection element, the first, second, third and fourth light detection elements evenly spaced from each other.

5. The portable electronic device of claim 4, wherein an imaginary line connecting the first light detection element and the third light detection element is substantially perpendicular to an imaginary line connecting the second light detection element and the fourth light detection element.

6. The portable electronic device of claim 1, wherein the ring-shaped container has an octagonal configuration.

7. The portable electronic device of claim 6, wherein the light detection elements and the light sources are disposed at four corners of the ring-shaped container, and each two neighboring corners of the four corners have one of the spare four corners of the ring-shaped container therebetween.

8. The portable electronic device of claim 7, wherein each of the four corners which the light sources and the light detection elements placed on has an internal angle θ ranged from 170 to 180 degrees.

9. The portable electronic device of claim 1, wherein each of the light detection elements is a charge coupled device.

10. The portable electronic device of claim 1, wherein the light sources are light emitting diodes.

11. The portable electronic device of claim 1, wherein each of the light detection elements is configured for sensing essentially only that part of the light that is transmitted through the gas bubble without reflection.

12. A portable electronic device, comprising:
    a main body comprising a top surface and a bottom surface at opposite sides thereof;
    a display screen formed on the main body at the top surface for displaying an image in an original orientation; and
    an orientation sensor mounted on the main body at the top surface, the orientation sensor comprising:
    a ring-shaped container comprising a first surface and an opposite second surface both in parallel with the display screen, the first surface facing the top surface, the first the ring-shaped container having an opaque liquid and a gas bubble sealed therein;
    a detection assembly including at least one light source arranged on the first surface of the ring-shaped container, and a plurality of spaced light detection elements arranged on the second surface of the ring-shaped container, the gas bubble being movable in the ring-shaped container in response to variation of posture of the display screen and configured for allowing transmission of light from the at least one light source therethrough, each of the light detection elements being configured for sensing the light transmitted through the gas bubble and outputting a sensing signal; and
    a display controlling module for deviating the displayed image at a given angle clockwise or counterclockwise from the original orientation of the image based on the sensing signals.

13. The portable electronic device of claim 12, wherein a sectional shape of the ring-shaped container is circular or quadrate.

14. The portable electronic device of claim 13, wherein the plurality of light detection elements comprises a first light detection element, a second light detection element, a third light detection element, and a fourth light detection element, the first, second, third and fourth light detection elements spaced apart from each other.

15. The portable electronic device of claim 14, wherein an imaginary line connecting the first light detection element and the third light detection element is substantially perpendicular to an imaginary line connecting the second light detection element and the fourth light detection element.

16. The portable electronic device of claim 12, wherein the ring-shaped container has a polygonal configuration.

17. The portable electronic device of claim 16, wherein the at least one light source comprises a plurality of light sources aligned with the respective light detection elements, and the light detection elements and the light sources are disposed at four corners of the ring-shaped container, with each two neighboring corners of the four corners being spaced by at least one of the remaining corners of the ring-shaped container.

18. The portable electronic device of claim 17, wherein each of the four corners which the light sources and the light detection elements located thereat has an internal angle θ ranged from 170 to 180 degrees.

* * * * *